United States Patent [19]

Inoue et al.

[11] Patent Number: 5,001,539
[45] Date of Patent: Mar. 19, 1991

[54] MULTIPLE LAYER STATIC RANDOM ACCESS MEMORY DEVICE

[75] Inventors: Yasuo Inoue; Tadashi Nishimura, both of Hyogo, Japan

[73] Assignee: Mitsubishi Denki Kabushiki Kaisha, Tokyo, Japan

[21] Appl. No.: 337,702

[22] Filed: Apr. 13, 1989

[30] Foreign Application Priority Data

Jul. 8, 1988 [JP] Japan ................. 63-171521

[51] Int. Cl.$^5$ ............. H01L 27/02; H01L 27/12; H01L 29/78; G11C 11/34
[52] U.S. Cl. ........................... 357/41; 357/4; 357/23.7; 365/182; 365/188
[58] Field of Search ............. 357/4, 41, 42, 23.7; 365/182, 188

[56] References Cited

U.S. PATENT DOCUMENTS 4,809,046 2/1989 Aoyama et al. ............. 357/41

FOREIGN PATENT DOCUMENTS 61-32467 2/1986 Japan .

OTHER PUBLICATIONS

Jacob Millman et al., "Microelectronics", 1987, pp. 356-358.

Primary Examiner—Mark Prenty
Attorney, Agent, or Firm—Lowe, Price, LeBlanc, Becker & Shur

[57] ABSTRACT

A stacked static random access memory SRAM having a plurality of memory cells is disclosed. Individual memory cell has a portion formed in an upper active element layer in the device structure and a portion formed in a lower active element layer in the device structure separated from the upper layer by an intermediate insulating layer. A word line, a bit line and access transistors are formed in the same upper active element layer, eliminating the need for interconnecting them through the insulating layer. The elimination of the inter-layer connections helps to reduce the number of through-holes required to be made in the insulating layer. This in turn reduces the area to be occupied by the memory cell and leads to a simplified manufacturing process of the SRAM.

12 Claims, 9 Drawing Sheets

MULTIPLE LAYER STATIC RANDOM ACCESS MEMORY DEVICE

BACKGROUND OF THE INVENTION

1. Field of the Invention

This invention generally relates to a static random access memory device, and in particular to a stacked static random access memory device in which active component elements are formed and arranged in two layers.

2. Description of the Prior Art

In order to have a brief background understanding on the prior art related to the field of the present invention, reference is made to FIG. 5 which schematically illustrates in block diagram the general arrangement of one prior-art static random access memory (hereinafter referred to as SRAM). As shown, the SRAM includes a plurality of memory cells 40 arrange in an array 40 for storing data signals. The SRAM also includes X and Y decoders 42 and 43 for providing signals $X_O$-$X_n$ and $Y_O$-$Y_n$, respectively, to designate the memory cells 40, and a sense amplifier 44 for reading out and amplifying the data signal stored in the memory cells 40.

In FIG. 6, there is shown a circuit configuration of a typical memory cell incorporated in the conventional SRAM. The memory cell 40 includes a CMOS flip flop connected between a supply voltage $V_{cc}$ and a ground potential $V_{ss}$, and a pair of accessing NMOS field effect transistors Q5 and Q6 connected between the flip flop and bit lines 33 and 34.

The flip flop has a pair of cross-coupled CMOS inverter. One inverter comprises a PMOS field effect transistor Q1 and an NMOS field effect transistor Q2, while the other inverter comprises a PMOS field effect transistor Q3 and an NMOS field effect transistor Q4. The accessing field effect transistors Q5 and Q6 have their gates connected to the word line 35. Conventionally, these six transistors for the SRAM cell are formed in a planar arrangement on a semiconductor substrate.

A description concerning to an operation of such SRAM cells as shown in FIG. 6 is seen, for example, on pages 356 to 358 of a textbook entitled "MICROELECTRONICS" (second edition copyrighted in 1987) authored by J. Millman et. al and published by McGraw-HILL BOOK COMPANY.

FIG. 7 shows schematically in a perspective illustration the arrangement of the six transistors for forming a memory cell on a flat semiconductor substrate. Reference characters used correspond to those in FIG. 6.

Three major layers of component parts for forming the memory cell in the flat semiconductor substrate of FIG. 7 are shown in FIGS. 8A-8C.

In a lower layer shown in FIG. 8A, there are provided n⁻ and p⁻ impurity diffusion regions, and coatings of gate oxide and polysilicon are successively applied over these impurity diffusion regions to form six transistors Q1-Q6. Contact portions C1-C4 indicated by the slashed designation are for interconnecting the electrodes of the transistors. The contact portions are connected by aluminum layers 31 and 32 formed in an intermediate layer of the substrate shown in FIG. 8B. The intermediate layer also has a word line 35 formed of aluminum and an interconnection 36 made of aluminum. The aluminum interconnection 36 is communicated to the supply voltage $V_{cc}$. In an upper layer of the substrate shown in FIG. 8C, there are formed aluminum bit lines 33 and 34 and aluminum interconnections 37 and 38 to the ground potential $V_{ss}$.

The SRAM cells have conventionally been formed in a planar arrangement on the semiconductor substrate as has been described above. However, as the cell density increases, additional structures have been incorporated into the memory device, for example, guard rings for the prevention of latch-ups, making the memory device more complex in construction. In order to overcome the problem, it has been proposed to form the SRAM memory in stacked arrangement.

In FIG. 9, there is schematically illustrated in perspective a circuit configuration of a memory cell for a prior-art double-layer stacked SRAM. The stacked SRAM of the type shown is disclosed in Japanese Laying-Open Gazette No. 32467/1986. The SRAM comprises a plurality of transistors formed and arranged in two layers on a semiconductor substrate. The transistors in different layers are interconnected via through-holes made to extend between the two layers on the substrate. The stacked SRAM is formed using Silicon-on-insulation (hereinafter refer to as SOI).

Referring to FIG. 9, on the upper or first active element layer, there are provided PMOS field effect transistors Q1 and Q3, and bit lines 33 and 34. The first electrode of each of the transistors Q1 and Q3 is connected to the supply voltage $V_{cc}$. The gate electrode of the transistor Q1 and the second electrode of the transistor Q3 are coupled together at a node N21. Similarly, the gate electrode of transistor Q3 and the second electrode of the transistor Q1 are connected together at a node N11.

Provided on the lower or second active element layer are NMOS field effect transistors Q2, Q4, Q5 and Q6 and a word line 35. Of these transistors, the transistors Q2 and Q4 have their first electrodes connected together to the ground potential $V_{ss}$. The gate electrode of the transistor Q2 and the second electrode of the transistor Q4 are coupled together at a node N22, while the gate electrode of transistor Q4 and the second electrode of the transistor Q2 are linked together at a node N12.

The upper and lower layers being separated by an insulating layer (not shown) desired electrical interconnections between these layers are attained by a conductive through-holes made to extend between them. Thus, a through-hole 51 is made through the intermediate insulating layer for an electrical interconnection between the node N11 on the upper layer and the node N12 on the lower layer. Made also through the insulating layer is a through-hole 52 for an electrical interconnection between the node N21 on the upper layer and the node N22 on the lower layer. Transistors Q1, Q3, Q2 and Q4 on the different layers are interconnected via the through-holes 51 and 52 to form a CMOS flip flip.

On the second or lower layer, the accessing field effect transistor Q5 has its first electrode connected to the node N12 and its gate electrode connected to the word line 35. Similarly, the transistor Q6 has its first electrode connected to the node N22 and its gate electrode connected to the word line 35. The second electrode of transistor Q5 is coupled to the bit line 33 on the upper layer via the through-hole 53. In a similar manner, the second electrode of transistor Q6 is coupled to the bit line 34 on the upper layer via the through-hole 54.

FIGS. 10A and 10B show plane configurations of the upper and lower active layers of the SRAM cell of FIG. 9.

As shown in FIG. 10A and 10B, a p type impurity diffusion layer 55 is created in a SOI layer of the upper layer. The impurity diffusion layer 55 is covered by a gate oxide coating (not shown), on which polysilicon 60 is selectively deposited, thereby to form transistors Q1 and Q3. On the other hand, in the lower layer, a n type impurity region 56 is created in the p− region of the semiconductor substrate. The impurity region 56 is covered by a gate oxide coating (not shown), on which polysilicon 71 is selectively deposited, thereby to form transistors Q2, Q4, Q5 and Q6. Through-holes 51, 52, 53 and 54 are made to extend between the upper and lower layers as has been described hereinabove. The cross-coupled interconnections between the transistors are not shown.

With the arrangement of the prior art stacked SRAM cell shown in FIG. 9, four through-holes 51, 52, 53 and 54 are required for every memory cell. Of these through-holes, the through-holes 53 and 54 are shared by adjacent memory cells. Accordingly, the total effective area occupied by the through-holes 53 and 54 is equal to the effective area S occupied by a single through-hole. The total effective area of the through-holes 51 and 52 is equal to 2S. This brings the total area occupied by the through-holes 51, 52, 53 and 54 to 3S. A relatively large area consumed by the through-holes is a notable factor working against an increased cell density in the SRAM.

Referring to FIG. 11, there is shown in cross section a local oxidation of silicon (hereinafter refer to as LOCOS) 81 formed on the lower layer in the SRAM cell of FIG. 9 for the device isolation in the lower layer. A coating 69 of $SiO_2$ is formed over the p− region 66 of the substrate. Applied on the $SiO_2$ coating is a coating 68 of SiN. As can be seen in FIG. 11, the LOCOS 81 includes portions called bird's beaks extending between the SiN layer 68 and the p− substrate 66. Assuming that the thickness of the LOCOS 81 is 5,000 A, the length L1 of the bird's beak would be about 5,000 A. In the SRAM cell shown in FIG. 9, four transistors are provided in the lower layer. In order to isolate these transistors, many LOCOS regions 81 must be made, which is undesirable in terms of increasing the cell density.

FIG. 12 shows in enlarged cross-section a small portion of the SRAM cell of FIG. 9. The SOI layer 62 in the upper layer is covered by a gate oxide coating 61, on which polysilicon 60 is selectively deposited, thereby to form a field effect transistor. On the other hand, in the lower layer, a p− region 66 is created in the n-type silicon substrate 67. The p− region 66 is covered with a gate oxide coating 65, upon which polysilicon is selectively deposited to form a field effect transistor. The resulting field effect transistor is covered by an insulating coating (72), which in turn is covered with a polysilicon layer 64. The polysilicon layer 64 is connected to the drain or source of the resultant transistor. Provided between the polysilicon layer 64 and the SOI layer 62 is an insulating layer 63 for separating the upper layer from the lower layer.

The substrate through-holes 51 and 53 of FIG. 9 may be formed having different depths by etching and filling the holes with a conductive material. For the formation of holes having different depths by means of etching, the etching rates for the silicon and oxide layer must be precisely controlled to be much different from each other as required, making the fabrication process evermore complicated.

SUMMARY OF THE INVENTION

One object of the invention is to reduce the area occupied by stacked memory cells.

Another object of the invention is to reduce the area in a stacked SRAM device occupied by memory cells.

Yet another object of the invention is to provide a SRAM device which can be easily made.

Still another object of the invention is to reduce the number of through-holes in a stacked SRAM device.

Another object of the invention is to provide a stacked SRAM device having a reduced isolation area.

Still another object of the invention is to provide a stacked SRAM device having through-holes all etched to a common depth.

A stacked SRAM according to the invention has a memory cell. The memory cell includes a flip flop formed in first and second active element layers separated by an intermediate insulation layer. The memory cell also includes a bit line provided in the first active element layer for supplying data signals and retrieving data signals from the flip flop; a word line provided in the first active element layer for supplying control signals to the flip flop; and a switching element connected between the flip flop and the bit line and operative in response to signals from the word line.

In the stacked SRAM of the invention, the word line, the bit line, the switching element and common input and output of the flip flop are all provided on the first active element layer, eliminating the need for inter-layer interconnections among them.

A stacked SRAM according to the invention, in an aspect, has a memory cell occupying first and second active element layers separated by an insulating layer. The memory cell comprises first cross-coupled transistors on the first active element layer; bit lines and word lines formed on the first active element layer; access transistors on the first active element layer and controlled by one of the word lines for coupling between the first transistors and first and second ones of bit lines; and second cross coupled transistors on the second active element layer. Corresponding nodes of the first and second transistors are connected through first and second through-holes formed in the insulating layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 1:
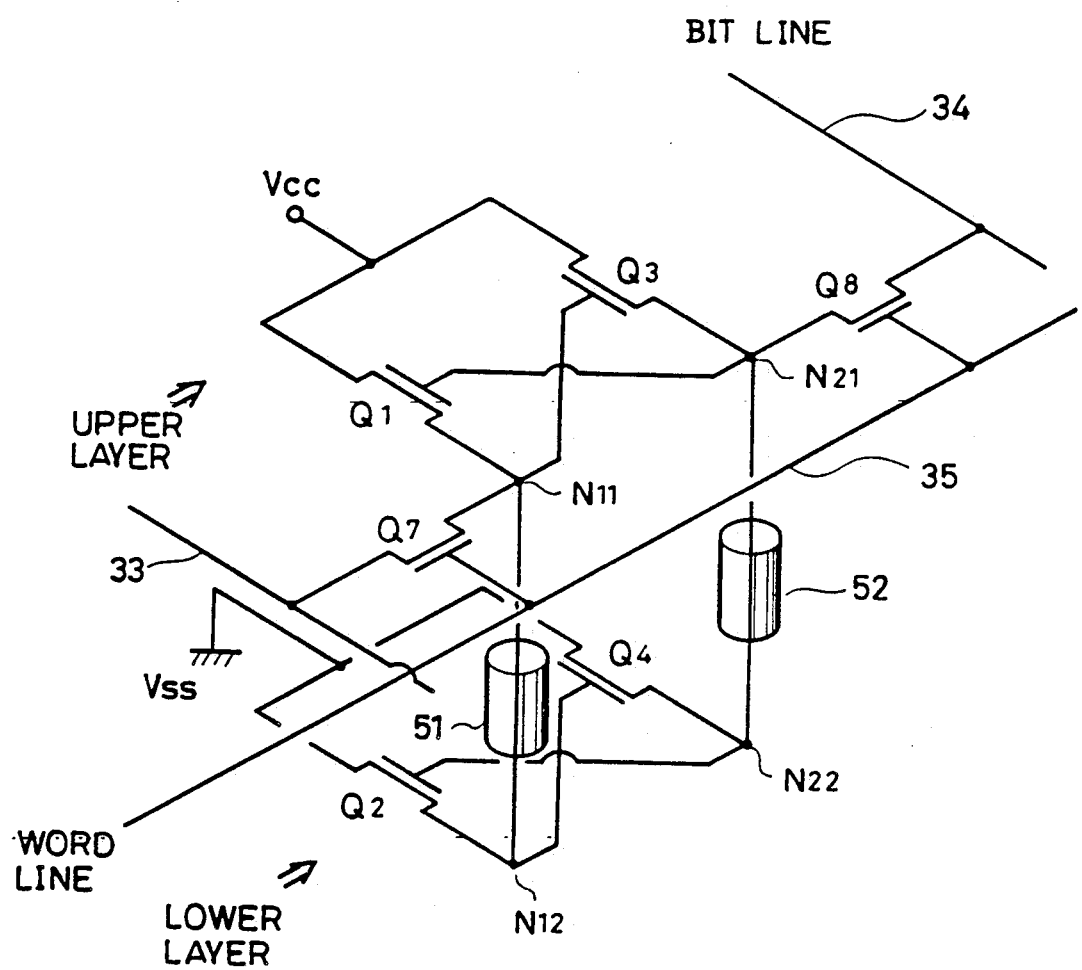
FIG. 1 is a schematic illustration in perspective showing the circuit configuration of a memory cell in a stacked SRAM according to one embodiment of the invention.

Referring to FIG. 1, there is schematically illustrated the circuit configuration of a memory cell in a stacked static random access memory or SRAM. In contrast to the memory cell configuration of FIG. 9, the memory cell of FIG. 1 has a word line 35 formed in a upper active element layer. Accessing PMOS field effect transistors Q7 and Q8 are also provided in the upper layer. More specifically, the transistor Q7 has the first electrode coupled to the node N11 of the flip flop and the second electrode to the bit line 33. The control electrode of the transistor Q7 is connected to the word line 35. Similarly, the transistor Q8 has the first electrode coupled to the node N11 and the second electrode coupled to the bit line 34. The control electrode of the transistor Q8 is connected to the word line 35. All of these connections are implemented on the upper layer.

Figure 9:
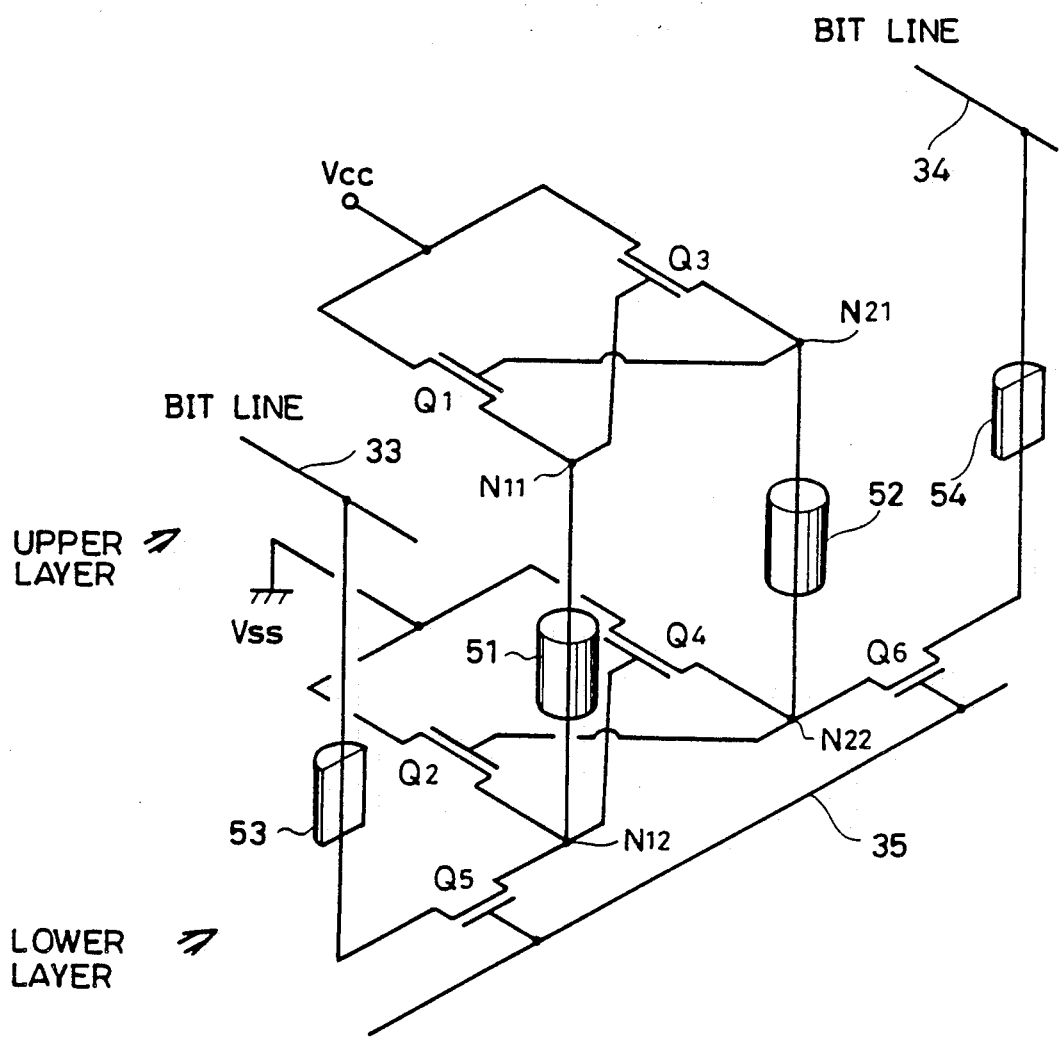
FIG. 9 is a schematic illustration in perspective showing the circuit configuration of a memory cell included in a prior-art stacked SRAM.
Figure 10A:
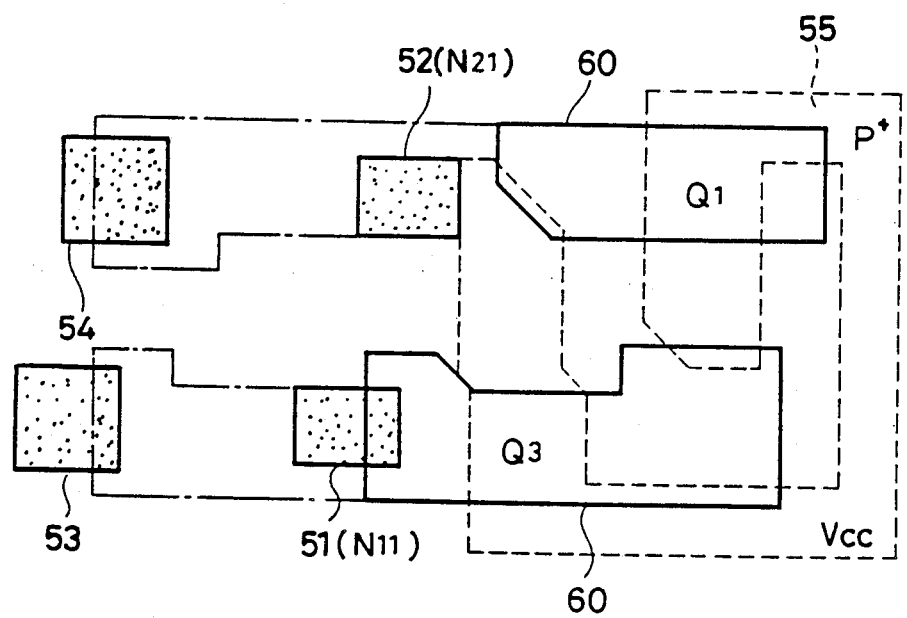
FIGS. 10A and 10B are plan views of upper and lower active element layers comprising the memory cell of FIG. 9.
Figure 10B:
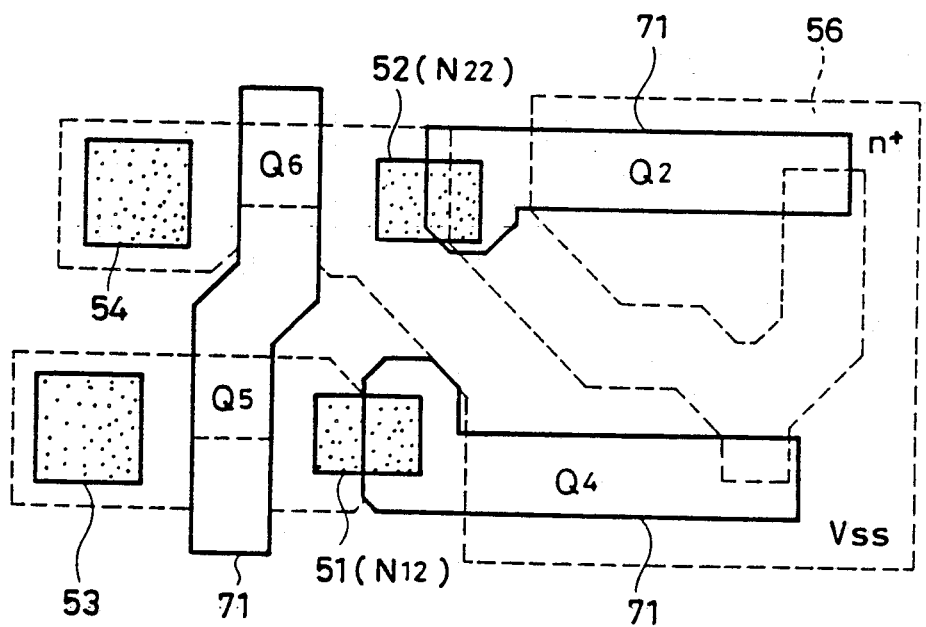

In this manner, according to the arrangement of the invention, all of the electrical connections related to the accessing transistors Q7 and Q8 are done in one and the same upper layer, eliminating the need for the through-holes such as holes 53 and 54 to interconnect the accessing transistors to the bit line in the prior art SRAM device of FIG. 9. In the SRAM cell of the invention, only two through-holes 51 and 52 are required for the interconnecting purpose which occupy the area equal to 28. This is a remarkable reduction of the area in SRAM cell consumed by the through-holes, which allows the SRAM cell to be of greater cell density.

Figure 2A:
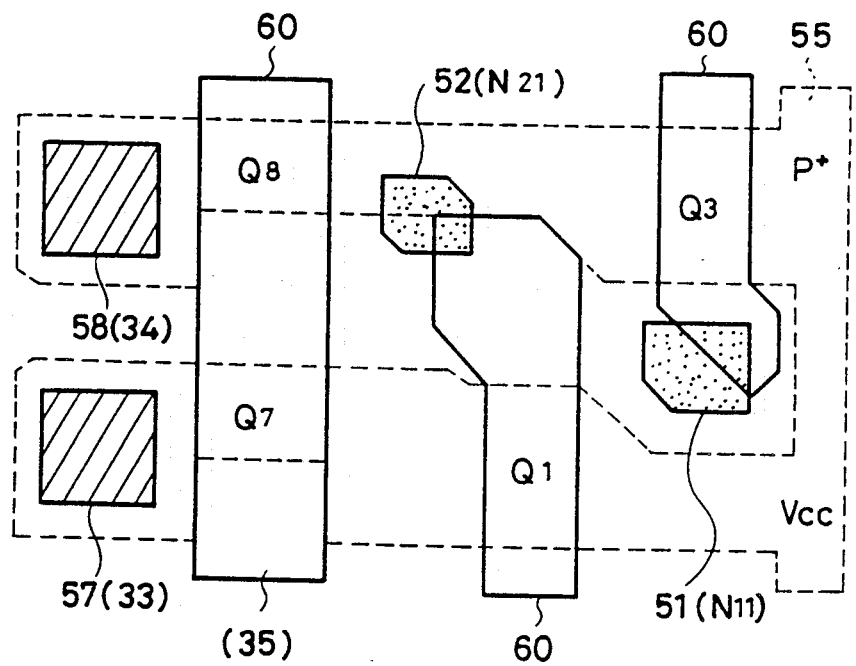
FIGS. 2A and 2B are plan views of upper and lower active element layers in the SRAM cell of FIG. 1.
Figure 2B:
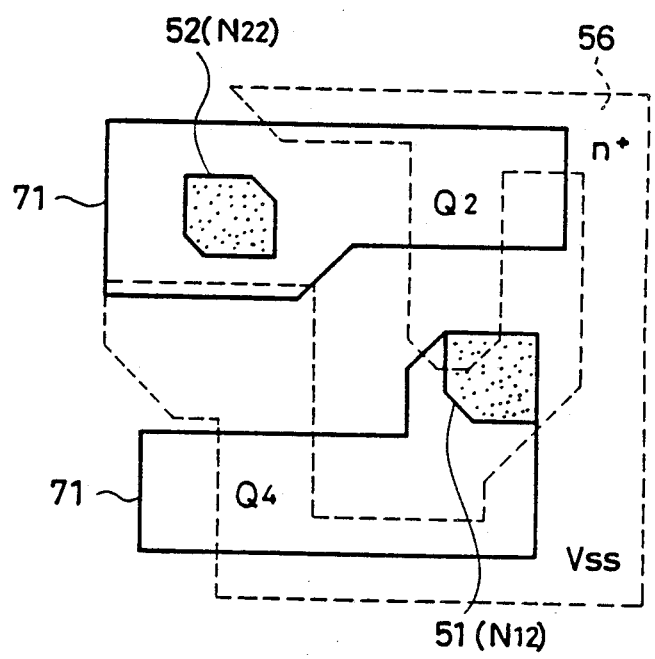

Referring to FIGS. 2A and 2B which show the plane configurations of the upper and lower active element layers, respectively, a p impurity diffusion region 55 is created in an SOI layer in the upper layer of active element. The impurity diffusion region is covered by a gate oxide coating (not showing), upon which polysilicon strips 60 are selectively deposited to form PMOS field effect transistors Q1, Q3, Q7 and Q8. The gates of the transistors Q7 and Q8 are included in the polysilicon strip 60 which forms the word line 35. The bit lines 33 and 34 are connected to the transistors Q7 and Q8 via contact holes 57, 58. The position of one through-hole 51 corresponds to that of the nods N11 in FIG. 1 and the position of the other through-hole 52 to that of the node N12.

In the lower active element layer of shown in FIG. 2B, a n impurity region 56 is created in a p⁻ region of the semiconductor substrate. The impurity region 56 is covered by a gate oxide coating (not shown), upon which polysilicon strips 91 are selectively deposited thereby to form NMOS field effect transistors Q2 and Q4. The n impurity region 56 is connected to a ground potential $V_{ss}$. The position of the through-hole 51 corresponds to the node N12 in FIG. 1, and the position of the through-hole 52 to the node N22.

Figure 3:
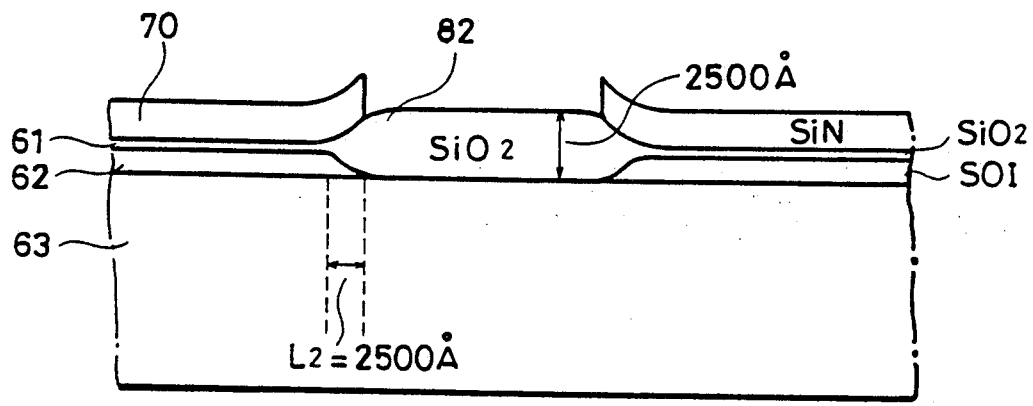
FIG. 3 is a sectional view showing a LOCOS formed in the upper active element layer of the SRAM cell of FIG. 1.
Figure 11:
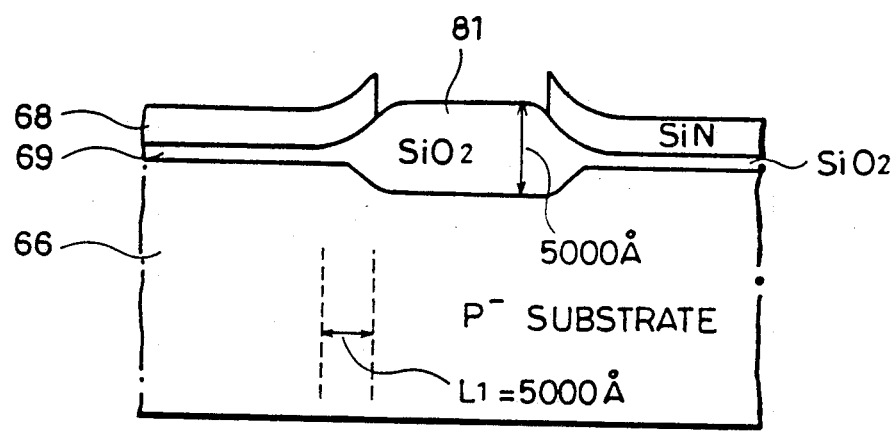
FIG. 11 is a sectional view of a LOCOS formed on the lower active element layer of FIG. 9.
Figure 12:
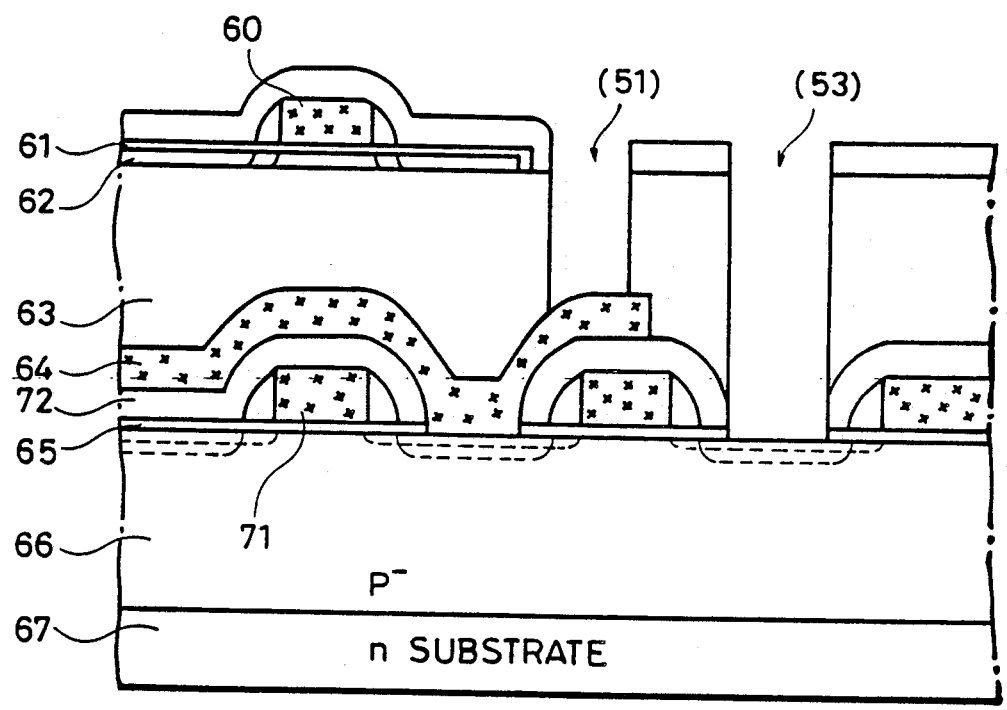
FIG. 12 is a sectional view of the memory cell shown in FIG. 9.

Shown in FIG. 3 is a LOCOS 82 formed in the upper layer of the SRAM of FIG. 1. On an insulating layer 63 for separating the upper layer from the lower layer, there is deposited an SOI layer 62. A $SiO_2$ layer 61 and an SiN layer 70 are successively positioned on the SOI layer 62. The LÔCOS 82 has bird's beaks extending between the SiN layer 70 and the SOI layer 52. Assuming the thickness of the LOCOS 82 to be 2,500 A, the length of L2 of the bird's beak is approximately 2,500 A which is enough to isolate the SOI layer. It is obvious that the length L2 of the bird's beak in the locos 82 is substantially shorter than the length of L1 of the bird's beak in the LOCOS 81 formed on the lower layer of FIG. 11. With the SRAM of FIG. 1, four Transistors are provided on the upper layer. However, the bird's beak length L2 being far shorter, the cell area consumed by the LOCOS 82 is made smaller than in the prior art.

Figure 4:
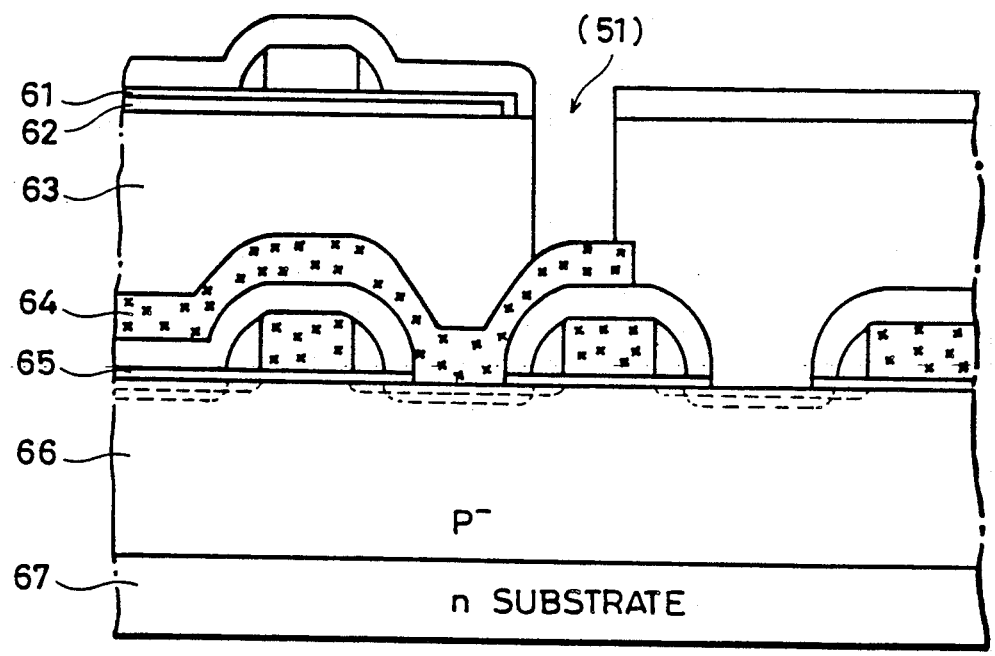
FIG. 4 is an enlarged sectional view of the SRAM cell shown in FIG. 1.
Figure 5:
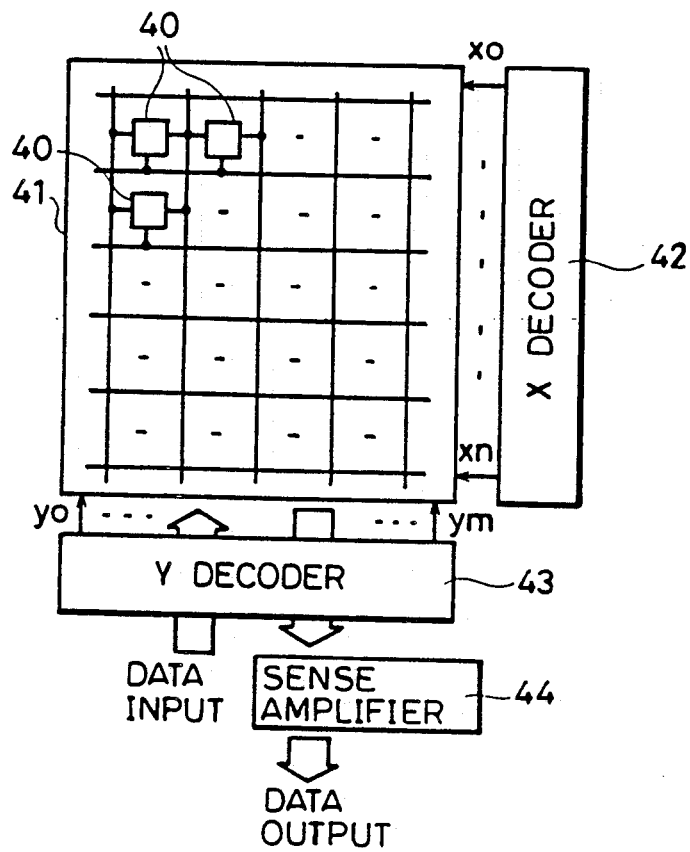
FIG. 5 is a block diagram showing a general arrangement of a prior-art SRAM.
Figure 6:
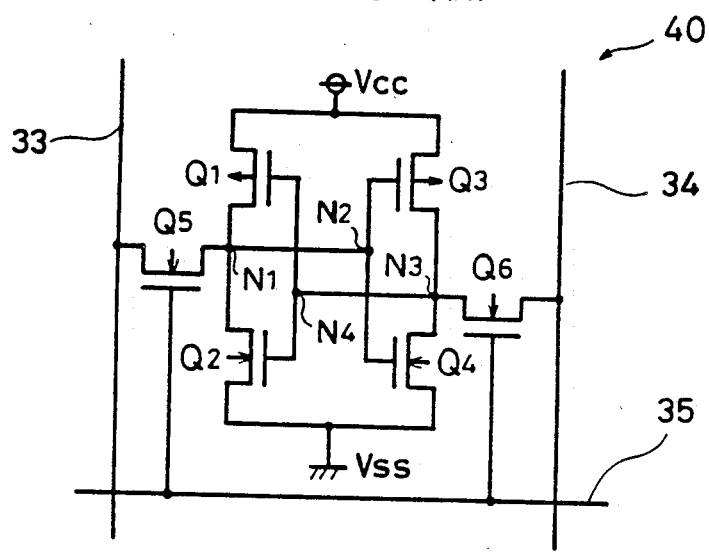
FIG. 6 is a circuit diagram of a memory cell included in the prior art SRAM.
Figure 7:
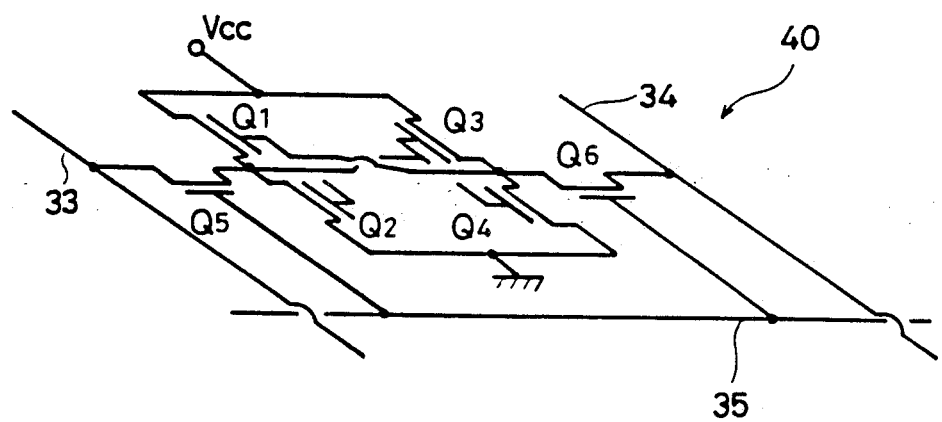
FIG. 7 is a schematic illustration in perspective showing the circuit configuration of a memory cell included int he prior-are SRAM.
Figure 8A:
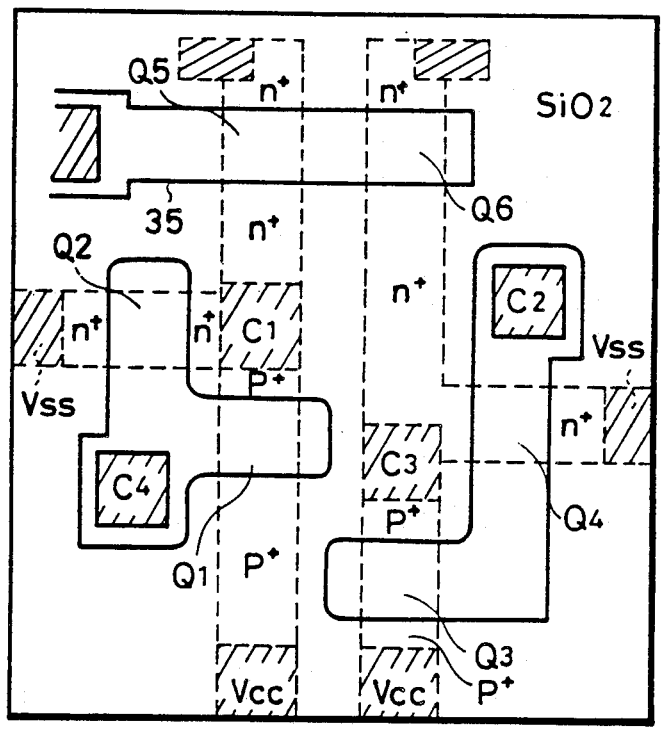
FIGS. 8A-8C are plan views showing the arrangement of the memory cell of FIG. 7 in its three plans of different levels.
Figure 8B:
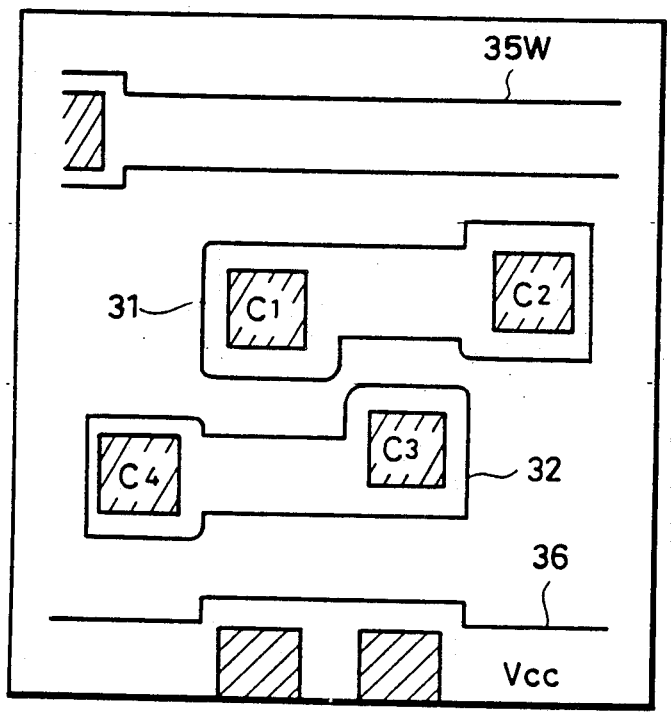
Figure 8C:
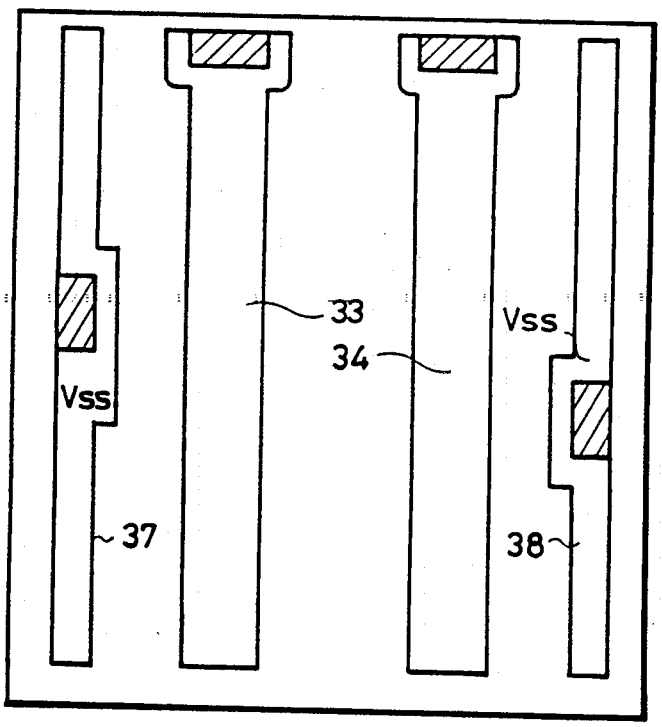

Referring to FIG. 4, a small part of the SRAM cell of FIG. 1 is shown in enlarged cross-section. In contrast to the prior-art SRAM cell, only through-holes 51 and 52 are to be made in the SRAM cell of the invention, omitting the through-hole 53. The through-holes 51 and 52 being of the same depth, the fabricating process for the SRAM is made simpler without the necessity of controlling the etching rate as in the prior art to provide through-holes of the varying depth.

In the structure of the SRAM cell shown in FIG. 1, it is advantageously possible to locate the seed for forming the SOI layer on the lower layer where there is relatively large unoccupied area available as a result of a smaller number of transistors being formed in the lower layer of active element.

In the illustrated embodiment, the PMOS field effect transistor is provided on the upper layer, and the NMOS field effect transistor on the lower layer. However, the NMOS field effect transistor may suitably be formed on the upper layer and the PMOS field effect transistor on the lower layer.

The two-layer SRAM cell design of the invention may be incorporated in any two adjacent active element layers in an integrated circuit device having more than two stacked layer of active element. Active element layers may be stacked by bonding them together.

Techniques useful for the bonding of the active element layer are disclosed in an article entitled, "Direct Bonding of Silicon Wafers" that appeared in pp. 373-376 of "Applied Physics," Vol. 56, No. 3 published in 1987.

As has been described in detail hereinabove, in the conventional stacked SRAM structure, the bit lines, the word line are formed in two different active element layers, making it necessary to make through-holes between the two active element layers for interconnecting the bit lines and word line via the access transistors. In contrast, according to the invention, the bit lines, the word line and the associated access transistors are all formed in the same active element layer, eliminating the need for the inter-layer, interconnecting through-holes. Accordingly, the number of through-holes in a stacked SRAM is reduced. The elimination of the inter-layer through-holes contributes to an SRAM which is simple in physical structure and whose individual memory cells occupy smaller areas therein. Furthermore, the birds beak length L2 or the isolation area of the LOCOS 82 shown in FIG. 3 was made small. In addition, as shown in FIG. 4, it became possible to that the stacked SRAM has through-holes all etched to a common depth, as shown in FIG. 4. This in turn allows a greater number of memory cells to be accommodated in the SRAM on one hand, and makes for a simplified manufacturing process on the other hand.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A stacked static random access memory device having a memory cell occupying first and second active element layers separated by an insulating layer, said memory cell comprising:
    flip flop means occupying said first and second active element layers, said flip flop means having input/output means provided in said first active element layer;
    word line means provided in said first active element layer;
    bit line means provided in said first active element layer; and
    switching means provided in said first active element layer and connected to said word line means, said bit line means and said input/output means of said flip flop means for electrically connecting said bit line means to said input/output means of said flip flop means in response to control signals from said word line means.

2. A stacked static random access memory device according to claim 1 wherein said insulating layer has through-holes formed therein to extend only between corresponding nodes of said flip flop means on said first and second active element layers.

3. A stacked static random access memory device according to claim 1 wherein said flip flop means comprises first and second inverter means provided in said first and second active element layers, respectively, and said first and second inverter means are cross-coupled to each other.

4. A stacked static random access memory device according to claim 3 wherein said first active element layer comprises a layer for forming active elements of one conductivity type,
    said second active element layer comprises a layer for forming active elements of the opposite conductivity type, and
    said first and second inverter means comprise first complementary inverter means and second complementary inverter means, respectively.

5. A stacked static random access memory device according to claim 4 wherein said first active element layer comprises a silicon on insulator layer.

6. A stacked static random access memory device according to claim 4 wherein:
    said input/output means of said flip flop means comprises first and second input/output terminals for receiving and supplying data signals, the data signal at said first input/output terminal being inverted with respect to the data signal at said second input/output terminal,
    said bit line means comprises first and second bit lines for supplying data signals and retrieving stored data signals from said flip flop means, the data signals on said first bit line being inverted with respect to the data signals second bit line,
    said switching means comprises a first switching element provided in said first active element layer and connected between said first input/output terminal of said flip flop means and said first bit line, and a second switching element provided in said first active element layer and connected between said second input/output terminal of said flip flop means and said second bit line, said first and second switching elements being driven into conduction in response to signals from said word line means.

7. A stacked static random access memory device according to claim 6 wherein said flip flop means comprises
    a first power supply node provided in said first active element layer,
    a second power supply node provided in said second active element layer,
    first and second field effect devices of one conductivity type formed in said first active element layer,
    each of said first and second field effect devices having a first electrode, a second electrode and a control electrode,
    said first electrodes of said first and second field effect devices being connected together to said first power supply node,
    said second electrode of said first field effect device and said control electrode of said second field effect device being connected together to form a first node in said first active element layer,
    said control electrode of said first field effect device and said second electrode of said second field effect device being connected together to form a second node in said first active element layer,
    third and fourth field effect devices of the opposite conductivity type formed in said second active element layer,
    each of said third and fourth field effect devices having a first electrode, a second electrode and a control electrode,
    said first electrodes of said third and fourth field effect devices being connected together to said second power supply node,
    said second electrode of said third field effect device and said control electrode of said fourth field effect device being connected together to form a third node in said second active element layer,
    said control electrode of said third field effect device and said second electrode of said fourth field effect device being connected together to form a fourth node in said second active element layer,
    first conductive means provided through said insulating layer to electrically connect said first node to said third node,
    second conductive means provided through said insulating layer to electrically connect said second node to said fourth node,
    said first complementary inverter means comprises said first and third field effect devices,
    said second complementary inverter means comprises said second and fourth field effect devices.

8. A stacked static random access memory device according to claim 7 wherein said first switching element comprises a fifth field effect device of one conductivity type formed in said first active element layer and wherein said second switching element comprises a sixth field effect device of said one conductivity type formed in the first active element layer, each of said fifth and sixth field effect devices having a first electrode, a second electrode and a control electrode, said fifth field effect device having its first electrode connected to said first input/output terminal of said flip flop means and its second electrode connected to said second bit line, said fifth and sixth field effect devices having their control electrodes connected together to said word line means.

9. A stacked static random access memory device according to claim 1 wherein said first power supply node comprises a power source for supplying positive voltage;

said second power supply node comprising a ground, said one conductivity type being p-type and said opposite conductivity type being n-type.

10. A stacked static random access memory device according to claim 1 wherein all of said field effect devices comprise field effect transistors.

11. A stacked memory cell occupying first and second active element layers separated by an insulating layer comprising:

flip flop means occupying said first and second active element layers, said flip flop means having input/output means provided in said first active element layer;

word line means provided in said first active element layer;

bit line means provided in said first active element layer; and switching means provided in said first active element layer and connected to said word line means, said bit line means and said input/output means of said flip flop means for electrically connecting said bit line means to said input/output means of said flip flop means in response to control signals from said word line means.

12. A stacked static random access memory device having a memory cell occupying first and second active element layers separated by an insulating layer, said memory cell comprising:

first cross-coupled transistors on the first active element layer;

bit lines and word lines formed on the first active element layer, said bit lines and word lines intersecting each other on the first active element layer;

access transistors on said first active element layer and controlled by one of said word lines for coupling between said first cross-coupled transistors and first and second bit lines; and second cross-coupled transistors on the second active element layer;

corresponding nodes of said first and second cross-coupled transistors being connected through first and second through-holes formed in said insulating layer.

* * * * *